(12) United States Patent
Chang et al.

(10) Patent No.: US 8,004,659 B2
(45) Date of Patent: Aug. 23, 2011

(54) VISION MEASURING MACHINE AND FOCUSING METHOD THEREOF

(75) Inventors: Chih-Kuang Chang, Taipei Hsien (TW); Li Jiang, Shenzhen (CN); Hua-Wei Yang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 268 days.

(21) Appl. No.: 12/205,934

(22) Filed: Sep. 8, 2008

(65) Prior Publication Data

US 2009/0310954 A1  Dec. 17, 2009

(30) Foreign Application Priority Data

Jun. 13, 2008 (CN) .......................... 2008 1 0302143

(51) Int. Cl.
*G01C 3/08* (2006.01)
(52) U.S. Cl. ........ 356/4.05; 356/4.01; 356/4.1; 356/5.01
(58) Field of Classification Search ........... 356/3.01–22, 356/28, 28.5
See application file for complete search history.

(56) References Cited

U.S. PATENT DOCUMENTS

2004/0245227 A1* 12/2004 Grafton-Reed et al. . 219/121.83
2005/0053274 A1*  3/2005 Mayer et al. .................. 382/154
* cited by examiner

*Primary Examiner* — Thomas H Tarcza
*Assistant Examiner* — Luke D Ratcliffe
(74) *Attorney, Agent, or Firm* — Altis Law Group, Inc.

(57) ABSTRACT

A vision measuring machine includes a stage for supporting a workpiece, an image capturing device movable relative to the stage, and a laser ranging module directed towards the stage. The laser ranging module is capable of emitting a laser beam to the workpiece to form a laser spot on the workpiece surface, and determining a distance between the laser spot and the laser ranging module.

6 Claims, 3 Drawing Sheets

VISION MEASURING MACHINE AND FOCUSING METHOD THEREOF

BACKGROUND

1. Field of the Invention

The present invention relates to a vision measuring machine.

2. Description of Related Art

Conventionally, a vision measuring machine is used for inspection of integrated circuits (ICs), read frames, IC packages, and so on. A vision measuring machine has a stage, and an image capturing device, such as a camera. A workpiece, such as an IC, is placed on the stage. In order to achieve high image quality of the workpiece, the lens of the image capturing device should be adjusted to a proper position to focus on the workpiece. Generally, the vision measuring machine uses special image recognition algorithms to analyze image quality when the lens of the image capturing device moves to different positions to determine the proper focusing position of the lens. The vision measuring machine measures a height of the workpiece according to the proper position of the lens. This focusing method relies on the image recognition algorithms; its precision is greatly influenced by the shape of the workpiece. This kind of vision measuring machines focuses slowly and makes it hard to precisely measure height of the workpiece.

DETAILED DESCRIPTION

Figure 1:
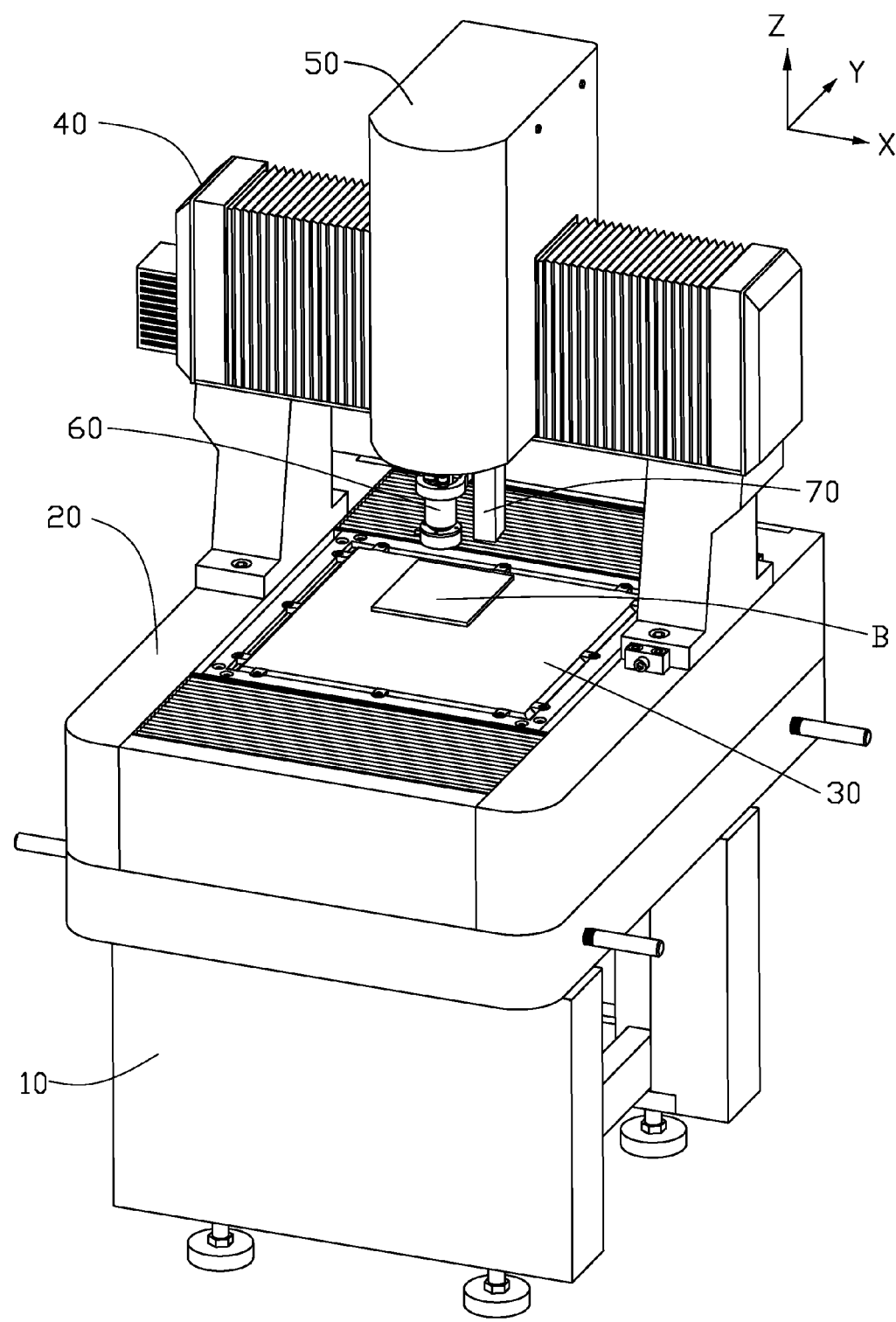
FIG. 1 is an assembled, isometric view of a vision measuring machine in accordance with an embodiment of the present invention.

Referring to FIG. 1, a vision measuring machine for measuring a workpiece B in accordance with an embodiment of the present invention is shown. The vision measuring machine includes a base 10, a chassis 20, a stage 30, two supports 40, a top cover 50, an image capturing device 60 and a laser ranging module 70. Herein X, Y, and Z axes of a Cartesian coordinate system are referred to.

The chassis 20 is fixed to the top of the base 10. The stage 30 for supporting the workpiece B thereon is attached to a middle part of the chassis 20. The chassis 20 includes a Y-axis driving system mounted therein to drive the stage 30 to move along the Y-axis. The base 10 includes a plurality of adjustable supporting feet to be adjusted to make the stage 30 horizontal, so as to ensure precise measuring.

The supports 40 are respectively fixed to two top sides of the chassis 20. An X-axis driving system is mounted between the supports 40. The top cover 50 attached to the X-axis driving system includes a Z-axis driving system mounted therein. The X-axis driving system can drive the Z-axis driving system to move along the X-axis. The image capturing device 60 and the laser ranging module 70 are mounted to the bottom end of the Z-axis driving system. The Z-axis driving system can drive the image capturing device 60 and the laser ranging module 70 to move along the Z-axis. The Z-axis is vertical to the stage 30. LK-G series laser displacement sensor of the KEYENCE Company can be selected as the laser ranging module 70.

The laser ranging module 70 can emit a laser beam to the workpiece B, and form a laser spot on a surface of the workpiece B. The laser ranging module 70 can determine a first distance between the laser spot and the laser ranging module 70. Z-axis coordinates of the image capturing device 60 and the laser ranging module 70 can be determined by a raster ruler attached to the Z-axis driving system. A Z-axis coordinate of the laser spot can be calculated according to the first distance. Then, a lens of the image capturing device 60 can be moved to a proper position to focus on the workpiece B according to a second distance between the Z-axis coordinates of the image capturing device 60 and the laser spot.

Figure 2:
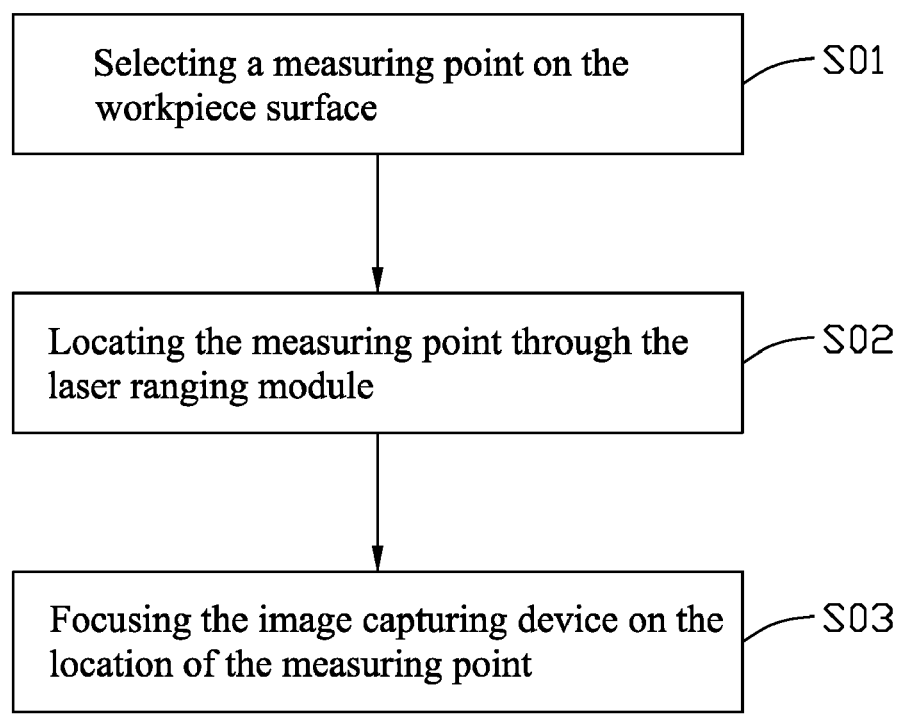
FIG. 2 is a flowchart of a first focusing method in accordance with another embodiment.

Referring to FIG. 2, the first focusing method in accordance with another embodiment includes the following steps:

S01: selecting a measuring point on the surface of the workpiece B.

S02: the X-axis driving system and the Y-axis driving system being moved to make the laser spot formed by the laser ranging module 70 move to the measuring point; then, determining a Z-axis coordinate of the measuring point through the laser ranging module 70.

S03: the image capturing device 60 focusing on the workpiece B according to the Z-axis coordinate of the measuring point, such that the image capturing device 60 can capture high quality images of an object at a plane parallel to the stage where the measuring point is located.

Figure 3:
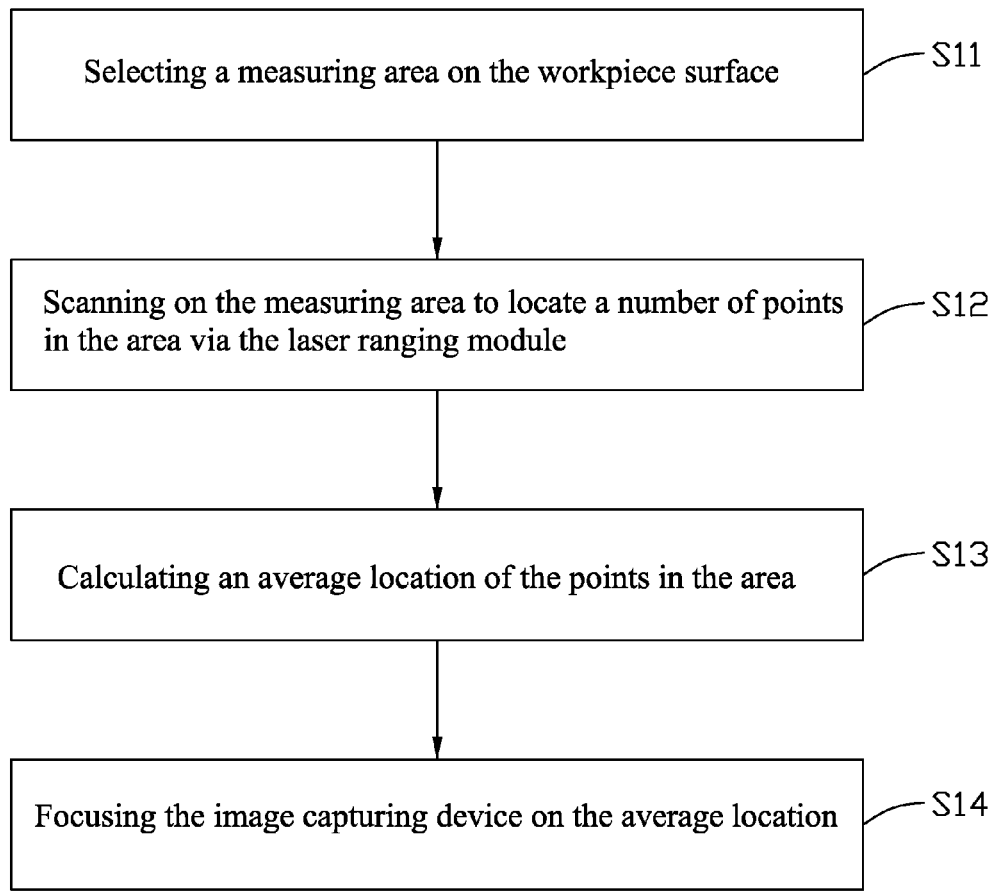
FIG. 3 is a flowchart of a second focusing method in accordance with another embodiment.

Referring to FIG. 3, the second focusing method in accordance with another embodiment includes the following steps:

S11: selecting a measuring area on the surface of the workpiece B, the measuring area can be any closed area, or a plurality of lines.

S12: the X-axis driving system and the Y-axis system being moved to make the laser spot scan the measuring area to determine a number of Z-axis coordinates of points in the area.

S13: calculating the average coordinate of these Z-axis coordinates.

S14: the image capturing device 60 focusing according to the average coordinate, such that the image capturing device can capture high quality image of the measuring area.

The precision of the laser ranging module is less influenced by the shape of the workpiece B, and the focusing course of the embodiments of the invention needs less computer processing relative to the conventional vision measuring machine. Therefore, the present vision measuring machine can achieve high focusing precision and speed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A focusing method of a vision measuring machine, the focusing method comprising:
   providing:
      a stage supporting a workpiece;
      an image capturing device movable relative to the stage; and
      a laser ranging module movable relative to the stage, and emitting a laser beam directed to the workpiece;

selecting a measuring point on the workpiece surface;

moving the laser ranging module to locate a laser spot formed by the laser beam at the measuring point;

getting a Z-axis coordinate of the laser spot in a Cartesian coordinate system with the laser ranging module;

focusing the image capturing device on the measuring point of the workpiece according to the Z-axis coordinate of the laser spot;

getting Z-axis coordinates of the image capturing device and the laser ranging module, and measuring the distance between the laser spot and the laser ranging module with the laser ranging module;

wherein the Z-axis coordinate of the laser spot is calculated according to the distance between the laser spot and the laser ranging module, and the Z-axis coordinate of the laser ranging module.

2. The focusing method as claimed in claim 1, wherein focusing comprises adjusting a lens of the image capturing device to a proper position.

3. A focusing method comprising:

providing:

a stage supporting a workpiece;

an image capturing device movable relative to the stage; and a laser ranging module movable relative to the stage, and emitting a laser beam directed to the workpiece;

selecting a measuring area on the workpiece surface;

moving the laser ranging module to make the laser spot scan the measuring area to get Z-axis coordinates of a number of points in the measuring area in a Cartesian coordinate system;

calculating an average Z axis coordinate of the points scanned by the laser ranging module;

focusing the image capturing device on the measuring area of the workpiece according to the average Z-axis coordinate;

getting Z-axis coordinates of the image capturing device and the laser ranging module, and measuring the distance between the scanned points and the laser ranging module with the laser ranging module;

wherein the Z-axis coordinate of each of the scanned points is calculated according to the distance between the scanned point and the laser ranging module, and the Z-axis coordinate of the laser ranging module.

4. The focusing method as claimed in claim 3, further comprising:

providing:

an X-axis driving system driving the laser ranging module to move along a X-axis in the Cartesian coordinate system; and a Y-axis driving system driving the laser ranging module to move along a Y-axis in the Cartesian coordinate system;

wherein the X-axis and the Y-axis are perpendicular to each other and parallel to the stage; and the scanning step comprises moving the X-axis driving system and the Y-axis driving system to make a laser beam emitted by the laser ranging module to scan on the measuring area.

5. The focusing method as claimed in claim 3, wherein the Z-axis coordinates of the image capturing device and the laser ranging module are measured with a raster ruler.

6. The focusing method as claimed in claim 1, wherein the Z-axis coordinates of the image capturing device and the laser ranging module are measured with a raster ruler.

* * * * *